United States Patent
McFarland et al.

(10) Patent No.: US 8,286,049 B1
(45) Date of Patent: Oct. 9, 2012

(54) CONFIGURABLE TRANSMITTER INCLUDING FLEXIBLE BLOCK CODER

(75) Inventors: William J. McFarland, Los Altos, CA (US); Kai Shi, Sunnyvale, CA (US); Bruce Busby, Los Altos, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 426 days.

(21) Appl. No.: 12/607,772

(22) Filed: Oct. 28, 2009

Related U.S. Application Data

(60) Provisional application No. 61/161,054, filed on Mar. 17, 2009.

(51) Int. Cl.
*H03M 13/00* (2006.01)

(52) U.S. Cl. .......................... 714/752; 714/751
(58) Field of Classification Search ................... 714/752, 714/751
See application file for complete search history.

(56) References Cited

U.S. PATENT DOCUMENTS

| | | | |
|---|---|---|---|
| 2007/0022352 A1* | 1/2007 | Eroz et al. | 714/752 |
| 2008/0109696 A1* | 5/2008 | Lakkis | 714/752 |
| 2008/0163024 A1* | 7/2008 | Lakkis | 714/752 |
| 2009/0319857 A1* | 12/2009 | Pisek et al. | 714/752 |
| 2010/0077276 A1* | 3/2010 | Okamura et al. | 714/752 |

\* cited by examiner

*Primary Examiner* — Charles Ehne
(74) *Attorney, Agent, or Firm* — Bever, Hoffman & Harms, LLP

(57) ABSTRACT

A configurable transmitter for a wireless communication system may include a flexible block coder, an IFFT block, an analog and RF block, and an antenna coupled in series. The flexible block coder may advantageously perform forward error correction and mapping of a data stream to generate a processed data vector. To perform these functions, the flexible block coder may include a data formatter and a multiplier. The data formatter may format the data stream into an output vector, whereas the multiplier may multiply the output vector by a configurable channel coding matrix to generate the processed data vector. The size of the output vector may be a reflection legacy compatibility and data rate. The size of the processed data vector is equal to a product of the output vector and an inverse of a coding rate. The channel coding matrix may be compressed.

52 Claims, 8 Drawing Sheets

$$\begin{bmatrix} x_{0,0} & \cdots & x_{0,29} \\ & & \\ & \vdots & \\ & \vdots & \\ & \vdots & \\ x_{48,0} & \cdots & x_{48,29} \end{bmatrix} \times \begin{bmatrix} a_{-6} \\ a_{-5} \\ a_{-4} \\ a_{-3} \\ a_{-2} \\ a_{-1} \\ a_0 \\ a_1 \\ \vdots \\ \vdots \\ a_{23} \end{bmatrix} = \begin{bmatrix} y_0 \\ y_1 \\ y_2 \\ \\ \vdots \\ \\ y_{47} \end{bmatrix}$$

Channel
Coding
Matrix
620

Output
Vector
615

Processed
Data Vector
625

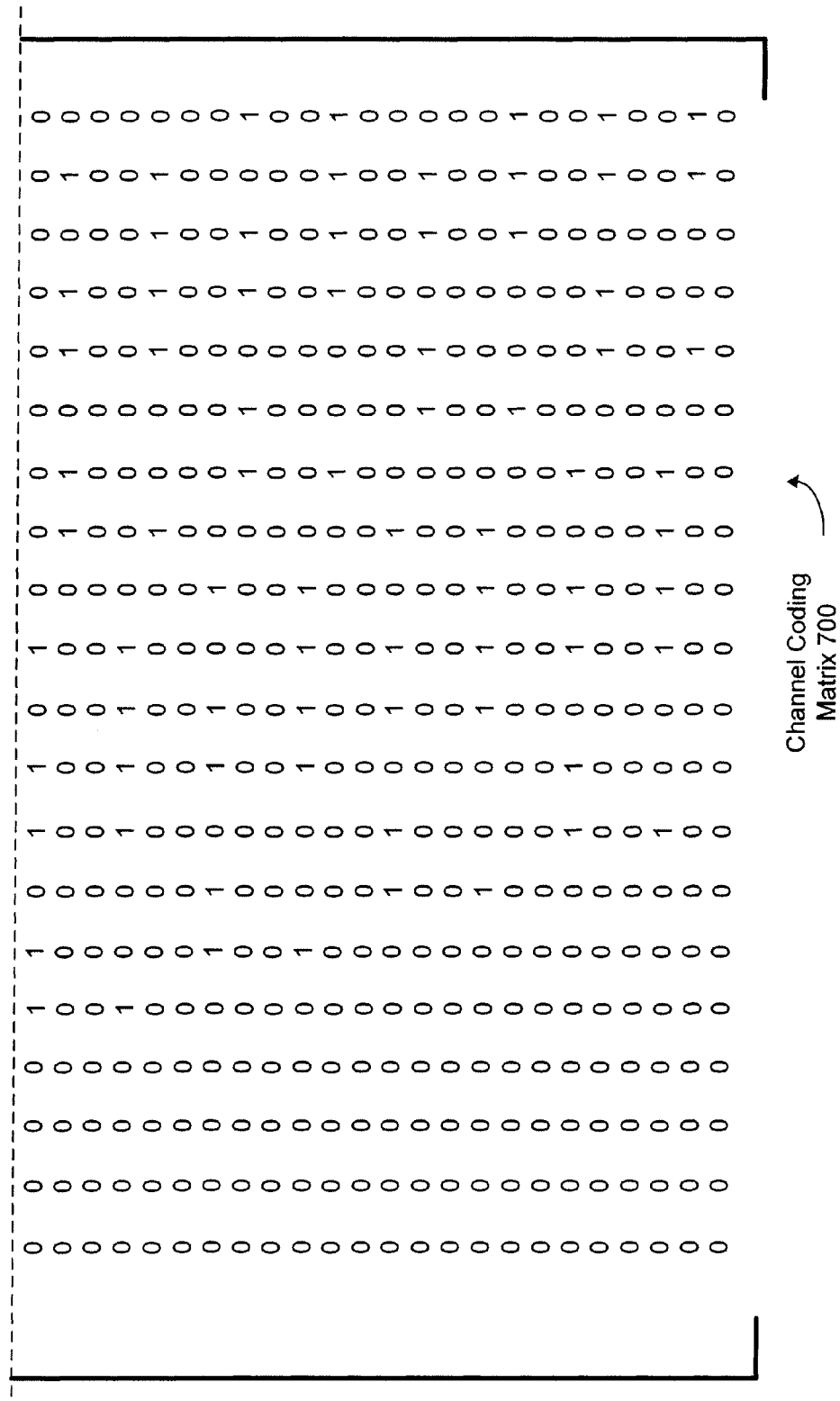
Fig. 7a2

| 000011 |
|---|
| 010011 |
| 100011 |
| 000010 |
| 010010 |
| 100010 |
| 000101 |
| 010101 |
| 100101 |
| 000100 |
| 010100 |
| 100100 |
| 000111 |
| 010111 |
| 100111 |
| 000110 |
| 010110 |
| 100110 |
| 001001 |
| 011001 |
| 101001 |
| 001000 |
| 011000 |
| 101000 |
| 001011 |
| 011011 |
| 101011 |
| 001010 |
| 011010 |
| 101010 |
| 001101 |
| 011101 |
| 101101 |
| 001100 |
| 011100 |
| 101100 |
| 001111 |
| 011111 |
| 101111 |
| 001110 |
| 011110 |
| 101110 |
| 010001 |
| 100001 |
| 110001 |
| 010000 |
| 100000 |
| 110000 |

Compressed Channel Coding Matrix 710

| 910 | 920 | 930 | 940 |
|-----|-----|-------|--------|
| 1 | 1 | 00001 | 000011 |
| 9 | 1 | 01001 | 010011 |
| 17 | 1 | 10001 | 100011 |
| 1 | 0 | 00001 | 000010 |
| 9 | 0 | 01001 | 010010 |
| 17 | 0 | 10001 | 100010 |
| 2 | 1 | 00010 | 000101 |
| 10 | 1 | 01010 | 010101 |
| 18 | 1 | 10010 | 100101 |
| 2 | 0 | 00010 | 000100 |
| 10 | 0 | 01010 | 010100 |
| 18 | 0 | 10010 | 100100 |
| 3 | 1 | 00011 | 000111 |
| 11 | 1 | 01011 | 010111 |
| 19 | 1 | 10011 | 100111 |
| 3 | 0 | 00011 | 000110 |
| 11 | 0 | 01011 | 010110 |
| 19 | 0 | 10011 | 100110 |
| 4 | 1 | 00100 | 001001 |
| 12 | 1 | 01100 | 011001 |
| 20 | 1 | 10100 | 101001 |
| 4 | 0 | 00100 | 001000 |
| 12 | 0 | 01100 | 011000 |
| 20 | 0 | 10100 | 101000 |
| 5 | 1 | 00101 | 001011 |
| 13 | 1 | 01101 | 011011 |
| 21 | 1 | 10101 | 101011 |
| 5 | 0 | 00101 | 001010 |
| 13 | 0 | 01101 | 011010 |
| 21 | 0 | 10101 | 101010 |
| 6 | 1 | 00110 | 001101 |
| 14 | 1 | 01110 | 011101 |
| 22 | 1 | 10110 | 101101 |
| 6 | 0 | 00110 | 001100 |
| 14 | 0 | 01110 | 011100 |
| 22 | 0 | 10110 | 101100 |
| 7 | 1 | 00111 | 001111 |
| 15 | 1 | 01111 | 011111 |
| 23 | 1 | 10111 | 101111 |
| 7 | 0 | 00111 | 001110 |
| 15 | 0 | 01111 | 011110 |
| 23 | 0 | 10111 | 101110 |
| 8 | 1 | 01000 | 010001 |
| 16 | 1 | 10000 | 100001 |
| 24 | 1 | 11000 | 110001 |
| 8 | 0 | 01000 | 010000 |
| 16 | 0 | 10000 | 100000 |
| 24 | 0 | 11000 | 110000 |

900

CONFIGURABLE TRANSMITTER INCLUDING FLEXIBLE BLOCK CODER

RELATED APPLICATIONS

This application claims priority of U.S. Provisional Patent Application 61/161,054, entitled "Interleaverless Channel Coder For Multi-Carrier Systems" filed Mar. 17, 2009.

BACKGROUND OF THE INVENTION

1. Field of the Invention

Embodiments in this specification generally relate to channel coding and more particularly to a configurable transmitter including a flexible block coder.

2. Description of the Related Art

Communication systems enable the transmission of data from one point to another through a medium. One example of a medium may be a wire such as those used by cable modems and the like. In another example, the medium may be air as in wireless communication systems such as Bluetooth® or IEEE 802.11-based wireless communications systems.

Generally, data to be transmitted may be modulated on one or more carriers. One well-known example of a multi-carrier system uses orthogonal frequency-division multiplexing (OFDM) in which a plurality of carriers are simultaneously modulated. A wireless OFDM system may conform to a specification such as those set forth by IEEE 802.11a/g/draft n.

Communication systems, especially multi-carrier systems, often rely on some amount of processing prior to transmitting data through the medium to enhance the overall reliability of the system. For example, forward error correction (FEC) may be applied to an input data stream to assist in the recovery of the data by a receiver. Often, FEC may add additional information to the original input data. The additional information may add redundancy that may decrease throughput, but may also aid in the correction of errors that may be introduced during transmission and/or reception.

Oftentimes, a processing step that follows FEC removes selected portions of the resultant FEC data stream. This removal may be done to increase the effective data throughput rate through the medium. By relying on the redundancy introduced by the FEC, the entire FEC data stream need not be transmitted in order for the input data stream to be reconstructed by the receiver. The process of removing selected portions of a data stream is often referred to as "puncturing".

In a multiple-input/multiple-output (MIMO) system, which provides multiple inputs to the receiver and multiple outputs from the transmitter, a stream parser is also applied to distribute FEC data bits to multiple spatial streams in round robin fashion.

Another processing step that is often applied is data interleaving. Instead of transmitting data, including FEC data, in a sequential order, the data may be rearranged or "interleaved". If sequential data is carried in a multi-carrier system by adjacent carriers, a noise source may affect two or more relatively nearby carriers, thereby increasing the difficulty of recovering transmitted data. Spreading data by interleaving may enable the distribution of sequential data onto non-adjacent carriers, thereby helping recover transmitted data sent in the presence of noise.

Many communication systems may also map data to be transmitted onto a symbol for actual transmission through the medium. A simple example is binary phase shift keying (BPSK) in which data can be mapped to one of two symbols. Since there are two symbols, either a "0" or a "1" may be mapped and sent. One logical extension is quadrature phase shift keying (QPSK) wherein data is mapped to one of four symbols. Thus, each symbol can represent two bits (00, 01, 10 or 11). A more complex mapping is called 64 QAM wherein data is mapped onto one of 64 points in a constellation field. As a result, each constellation point may represent 6 bits of data.

The above mentioned processing steps may be used in a multi-carrier communication system, such as in a wireless transmitter (e.g. a wireless transmitter conforming to industry specifications, such as one of the standards in the IEEE 802.11 family of standards). FIG. 1 is a block diagram of a wireless transmitter 100. The wireless transmitter 100 may include an FEC 110, an interleaver and mapper block 120, an Inverse Fast Fourier Transform block 130, an analog and radio frequency block 140, and an antenna 150 connected in series to form a transmit chain.

An exemplary FEC method described by the IEEE 802.11 specification may be implemented in hardware using a convolutional coder. FIG. 2 is a block diagram of an exemplary prior art convolutional coder 200 including a series of registers 202a-202f coupled in a daisy chain fashion and two modulo-two adders 210 and 215. Data 201 may be shifted through the registers 202a-202f. At selected points in the daisy chain, data bits may be fed to the modulo-two adders 210 and 215. In FIG. 2, the modulo-two adder 210 produces Output A and the modulo-two adder 215 produces Output B. The convolutional coder 200 can easily implement the FEC block 110 (FIG. 1) with relatively few gates. Such simple hardware implementations are particularly advantageous for communication systems that are implemented within an integrated circuit because simple hardware implementations use relatively little die area and may be easily optimized to run at relatively high clock rates.

Referring back to FIG. 1, the output of the FEC 110 may be coupled to the interleaver and mapper block 120, which may perform data interleaving and reorder the data from the FEC block 110. The interleaver and mapper block 120 may also map data onto symbols such as the 64 QAM symbols described above.

The interleaver and mapper block 120 may also perform data puncturing if required by a communication protocol. An exemplary puncturing is illustrated in FIG. 3. In this example, the two output streams produced by the FEC 110 may be represented by $A_0$, $B_0$ etc. After the data is generated by the FEC 110, certain elements of the generated data may be removed and then not transmitted through the medium. As described above, because the data has been coded by the FEC 110, the missing elements may be easily recovered at the receiving end. In the example of FIG. 3, the punctured elements B1 and A2 (shown with cross-hatched blocks) are removed, thereby resulting in the data stream shown on the right side of the arrow.

Referring back to FIG. 1, the IFFT block 130 may perform an Inverse Fast Fourier Transform. In some communication systems, this block may perform a Discrete Inverse Fourier Transform. Data from the interleaver and mapper block 120 may be coupled to the IFFT block 130. The output of the IFFT block 130 may coupled to the analog and RF block 140, which may process and modulate that output. The processed, modulated signal (now an RF signal) is then coupled to the antenna 150.

One advantage of the architecture shown in FIG. 1 is that the data 105 can stream through the transmitter 100 with minimal storage necessary. As a result, relatively little memory may be required to process the data 105, with the possible exception of the IFFT block 130 (because IFFT processing is a block oriented task).

Oftentimes, transmitter 100 is designed with logic gates and then formed in an integrated circuit. Thus, the processing steps performed by the FEC 110 and the interleaver and mapper block 120 become fixed as well. For example, if a new communication protocol requires a change to the coding provided by the FEC 110, the FEC 110 may need to be redesigned and that in turn may require a new integrated circuit containing the FEC 110. Similarly, an adjustment to the symbol mapping process or the data interleaving process may require a new design and a new integrated circuit.

Therefore, a need arises for a reconfigurable communication system, thereby enabling modifications in data error correction and data mapping, while eliminating the need for data interleaving.

SUMMARY OF THE INVENTION

A configurable transmitter for a wireless communication system including a flexible block coder, an IFFT block, an analog and RF block, and an antenna is described. The flexible block coder may advantageously perform forward error correction, and mapping of a data stream to generate a processed data vector. The flexible block coder may also perform coding over a block of data bits sufficiently large to emulate legacy interleaving. To perform these functions, the flexible block coder can include a data formatter and a multiplier. The data formatter may format the data stream into an output vector, whereas the multiplier can multiply the output vector by a configurable channel coding matrix to generate the processed data vector. The IFFT block may perform an IFFT on the processed data vector. The analog and RF block may process an output of the IFFT block and generate a transmit signal. The antenna can transmit the transmit signal.

In one embodiment, the data formatter can be configured to form an input vector, which when processed includes at least a number of data bits able to be modulated by the IFFT block. In another embodiment, the data formatter can be configured to form an input vector including a number of data bits able to be modulated by the IFFT block. In yet another embodiment, the data formatter can be configured to modify the input vector based on legacy compatibility. For example, the data formatter can be configured to modify the input vector by adding 6 bits, thereby matching bits from a convolutional coder conforming to IEEE 802.11a/g/n, or adding 12 bits, thereby matching bits from a plurality of convolutional coders. In one embodiment, the 6 bits can be equal to the last 6 bits of a previous input vector. In yet another embodiment, the data formatter can be configured to modify the input vector based on the data rate. In still another embodiment, the data formatter can produce a low density parity code (LDPC) block code. Such a block code may be used, for example, in IEEE 802.11n.

The size of the processed data vector can be equal to a product of the output vector and an inverse of a coding rate. Once the sizes of the output vector and the processed data vector are known, then the dimensions of the channel coding matrix can be determined. For example, a number of rows of the channel coding matrix can be equal to a size of the output vector, and a number of columns of the channel coding matrix can be equal to a size of the processed data vector.

In one embodiment, the channel coding matrix may be compressed. This compression may include indicating which of a plurality of patterns is required, and in which column a pattern may begin. In one embodiment, a required pattern can be indicated by a single bit. If the channel coding matrix is compressed, it might be advantageously uncompressed before multiplying with the output vector.

In one embodiment, the data formatter may be implemented by a processor. In another embodiment, the flexible block coder may further include a memory for storing at least a channel coding matrix.

In one embodiment, the flexible block coder may be implemented with more hardware. For example, the flexible block coder may include a plurality of registers connected in a daisy chain and a plurality of bit selectors for selecting outputs of the registers. An XOR tree may receive outputs of bit selectors and generate a processed data vector. In one embodiment, the bit selectors may be implemented using AND gates that receive the outputs of registers and entries from a row of a channel coding matrix. In another embodiment, bit selectors may be implemented using multiplexers receiving outputs of the registers and a fixed logic value, wherein the multiplexers are controlled by entries from a row of a channel coding matrix.

BRIEF DESCRIPTION OF THE DRAWINGS

FIG. 6 illustrates in greater detail an exemplary channel coding matrix, output vector, and processed data vector of a flexible block coder;

FIGS. 7a and 7b illustrate exemplary uncompressed and compressed channel coding matrices;

FIG. 9 illustrates a list of exemplary compressed and non-compressed channel coding matrices.

DETAILED DESCRIPTION

A flexible block coder may be used to construct flexible communication systems. As described in further detail below, this flexible block coder may trade block processing and memory usage for flexibility, thereby allowing modifications to data processing steps, even after an implementation of the design has been completed and an integrated circuit has been made.

Figure 1:
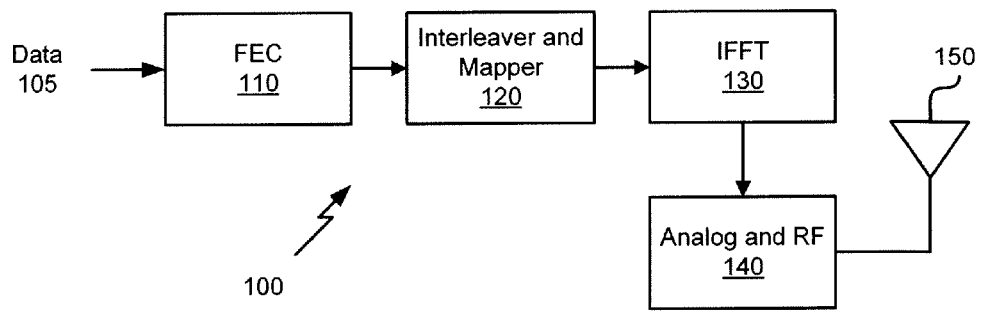
FIG. 1 is a block diagram of a wireless transmitter including a forward error correction (FEC) block, an interleaver and a mapper block, an IFFT block, an analog block and an RF processing block, and an antenna.
Figure 4:
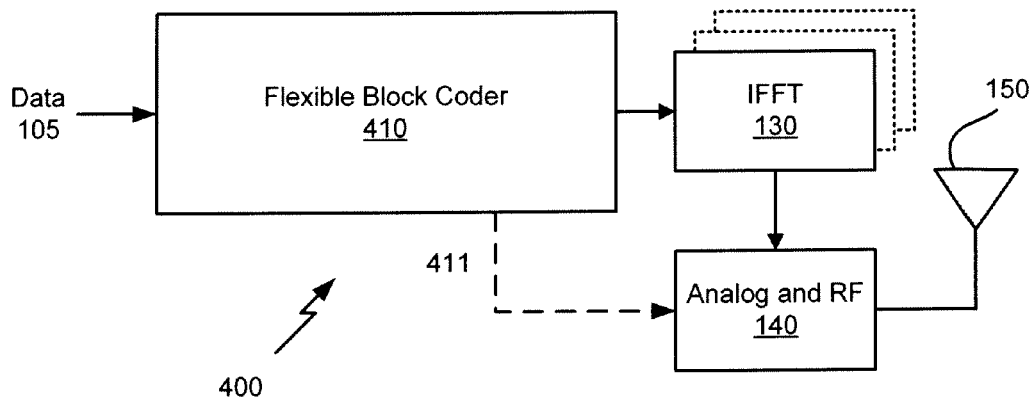
FIG. 4 is a block diagram of one embodiment of a transmitter including a flexible block coder, an IFFT block, an analog and RF processing block, and an antenna.

FIG. 4 is a block diagram of a configurable wireless transmitter 400 including a flexible block coder 410, an IFFT block 130, an analog and RF block 140, and an antenna 150. The flexible block coder 410 may accept data 105, form blocks of data, perform processing steps on the blocks of data, and couple a processed data vector to the IFFT block 130. Note that the blocks designated as data 105, the IFFT block 130, the RF block 140, and the antenna 150 may be substantially similar to the equivalent blocks described in FIG. 1.

Figure 5:
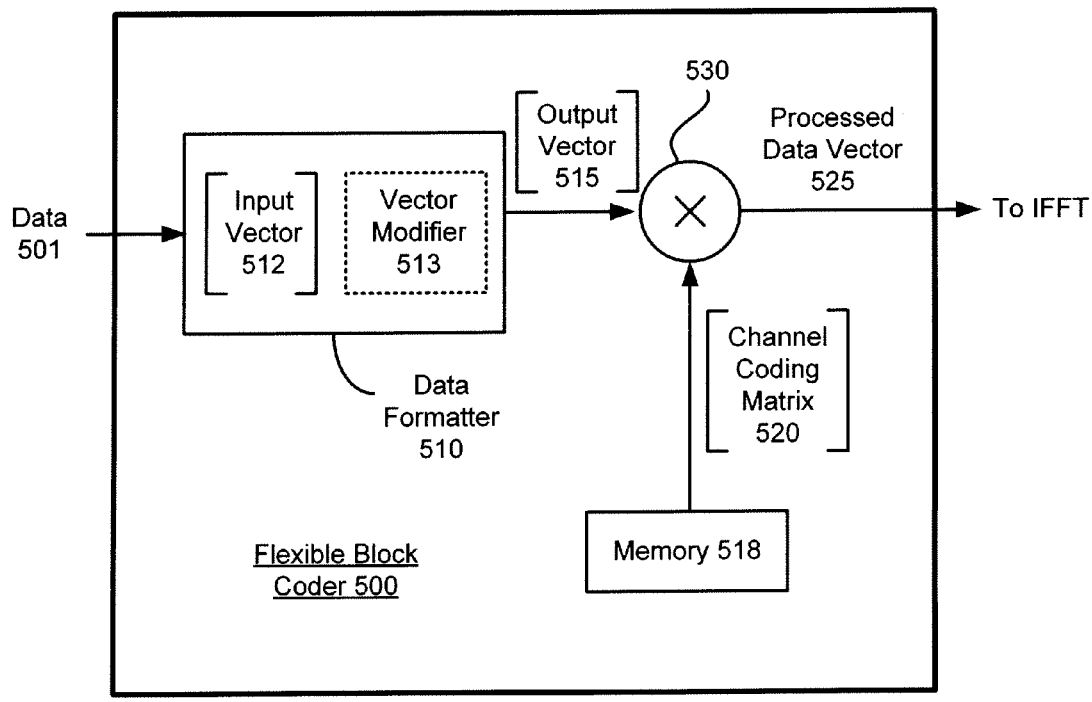
FIG. 5 is a block diagram illustrating one embodiment of a flexible block coder.

FIG. 5 is a block diagram illustrating one embodiment of a flexible block coder 500, which may include a data formatter 510, a memory 518, and a multiplier 530. In flexible block coder 500, data formatter 510 may receive and format data 501 into an input vector 512, extend this vector if necessary using a vector modifier 513, and generate an output vector 515. In a non-time-varying channel, e.g. in an 802.11 system, the input vector 512 may include the number of data bits that may be modulated in one IFFT block. For example in a 802.11a/g embodiment, a 6 Mbit/s rate may use 24 data bits, while an 801.11n embodiment supporting 600 Mbits/s may use 2160 data bits. In other implementations, the input vector 512 may include the data bits across a plurality of IFFT blocks (for example, the IFFT block 130 (FIG. 4) and one or more additional IFFT blocks (shown as shadow blocks in FIG. 4)). Typically, the number of IFFT blocks is an integer number. The number of bits associated with the IFFT block(s) may be characterized as a minimum number of bits in input vector 512.

The size of the input vector 512 may be changed using the vector modifier 513. For example, in one embodiment, the size of the input vector 512 may be changed for legacy compatibility. For example, to emulate legacy devices, it may be desirable for the flexible block coder 500 to create output sequences that match those from a convolutional coder. If so, then the vector modifier 513 can modify the size of the input vector 512 to match the number of bits contained in a convolutional coder. For example, when the flexible block coder 500 is used for 802.11 data, the number of additional bits in the output vector 515 (compared to input vector 512) may be 6 (for one convolutional encoder in 802.11a/g/n) or 12 (for two convolutional encoders when data rate >300 Mbps in 802.11n). In one embodiment, these additional 6 bits could be equal to the last 6 bits of the input vector 512, or in the case of the very first output vector 515, these additional 6 bit could be a defined starting state of a conventional convolutional encoder. Thus, for legacy compatibility based on an 802.11 convolutional FEC system, the size of the output vector 515 may be the number of data bits used to encode a single OFDM symbol plus one of the above-described sets of 6 bits.

Additionally, the size of the input vector 512 may be modified as the modulation scheme representing a particular data rate is changed. For example, for the lowest 802.11a/g rate (6 Mb/s) plus legacy compatibility, the output vector 515 may include 24+6=30 bits. For the highest 802.11a/g rate (54 Mb/s) plus legacy compatibility, the output vector 515 may include 216+6=222 bits. For 802.11n, using two streams, the highest data rate, 40 MHz channel bandwidth mode, plus legacy compatibility, the size of the output vector 515 may include 1080+6=1086 bits.

In one embodiment, the number of bits in the processed data vector 525 may be equal to the number of coded bits in a single symbol. This size can be calculated by multiplying the output vector 515 (minus the extended bits, if present) by the inverse of the coding rate. Using the 802.11 system and the same examples above, the processed data vector 525 may have the following sizes. For lowest 802.11a/g rate (6 Mb/s), the processed data vector 525 may be (30−6)*2/1=48 bits (because a ½ coding rate is used for that data rate). For the highest 802.11a/g rate, the processed data vector 525 may be (222−6)*4/3=288 bits (because a ¾ coding rate may be used for that data rate). For 802.11n, using two streams, the highest data rate, in a 40 MHz channel bandwidth mode, the size of the processed data vector 525 may be (1086−6)*6/5=1296 (because a ⅚$^{th}$ coding rate may be used). In another embodiment, the flexible block coder 500 may implement the optional LDPC FEC block coding technique specified in IEEE 802.11n.

As shown in FIG. 5, the output vector 515 may be multiplied by a channel coding matrix 520 to generate processed data vector 525 for the IFFT block (e.g. the IFFT block 130 shown in FIG. 4). Therefore, once the sizes of output vector 515 and processed data vector 525 are defined, the dimensions of the channel coding matrix 520 may be determined. In general, the channel coding matrix 520 has a number of columns equal to the size of the processed data vector and a number of rows equal to size of the output vector. Thus, for the case of the lowest 802.11a/g rate (6 Mb/s), the channel coding matrix 520 may be 30 columns by 48 rows, or a total of 1440 elements. For an exemplary high data rate the 802.11n two stream, 40 MHz data rate case, the channel coding matrix 520 may be 1086 columns by 1296 rows, or a total of just over 1.4 million elements. Because different modulation schemes or coding rates may require different channel coding matrices 520, a particular channel coding matrix 520 may be programmed, instantiated or loaded depending on the modulation scheme or coding rate desired.

In one embodiment, appropriate entries for channel coding matrix 520, i.e. selectors, can be generated based on input vector 512 and any modifications performed by vector modifier 513. Note that each of these selectors may be single bits (e.g., "1" or "0") or multiple bits, depending on the embodiment. The selectors in the channel coding matrix 520 may effectively "select" equivalent data from the output data vector 515 for multiplication based on their values. Moreover, the positions of these selectors in the channel coding matrix 515 may manipulate the data 501 to simultaneously accomplish forward error coding, stream parsing, data interleaving (for legacy devices only), as well as mapping and puncturing. Thus, the channel coding matrix 520 may be loaded for different modulation schemes, different transmission rates, or if different data puncturing methods are developed after the flexible coder block 500 has been committed to silicon.

In one embodiment, a processor may implement the functionality described for data formatter 510. This processor may also pre-compute and store one or more channel coding matrices 520 in memory 518, wherein a different channel coding matrix in the memory 518 may be accessed and sent to the multiplier 530 depending on the input vector 512 and the modification performed by vector modifier 513. Thus, with the exception of the product generation performed by multiplier 530, forward error correction, data interleaving, and data mapping may all be implemented substantially in software executed by a processor. Memory 518 may be implemented using random access memory (RAM), read only memory (ROM), FLASH ROM, hard drives, or other storage means. In another embodiment, one or more channel coding matrices 520 may be instantiated in a fixed manner in an integrated circuit.

FIG. 6 illustrates in greater detail an exemplary channel coding matrix 620, output vector 615, and processed data vector 625 of a flexible block coder 500. As explained above, the channel coding matrix 620 may be multiplied by the output vector 615 to generate the processed data vector 625. In one embodiment, the output vector 615 and the processed data vector 625, in addition to the channel coding matrix 620, may be stored in memory (e.g. memory 518 in FIG. 5). Note that in FIG. 6, bits $a_{-1}$-$a_{-6}$ represent 6 bits added to an input vector including bits $a_0$-$a_{23}$.

Note that the channel coding matrix 620 may be relatively large. Therefore, storing multiple channel coding matrices (e.g. storing a different channel coding matrix for each data rate) may require a large memory. In one embodiment, to reduce the memory allocated to channel coding matrices, one or more channel coding matrices may be compressed. Notably, each channel coding matrix may be generally sparse. Therefore, known data compression methods may significantly reduce the required storage size for the channel coding matrices. An exemplary compression method might include using the Lempel-Ziv algorithm, which is known to those skilled in the art. Notably, in the case of 802.11, further inspection of the channel coding matrices further indicates a regular structure/pattern that may be exploited, thereby further improving compression.

Figure 2:
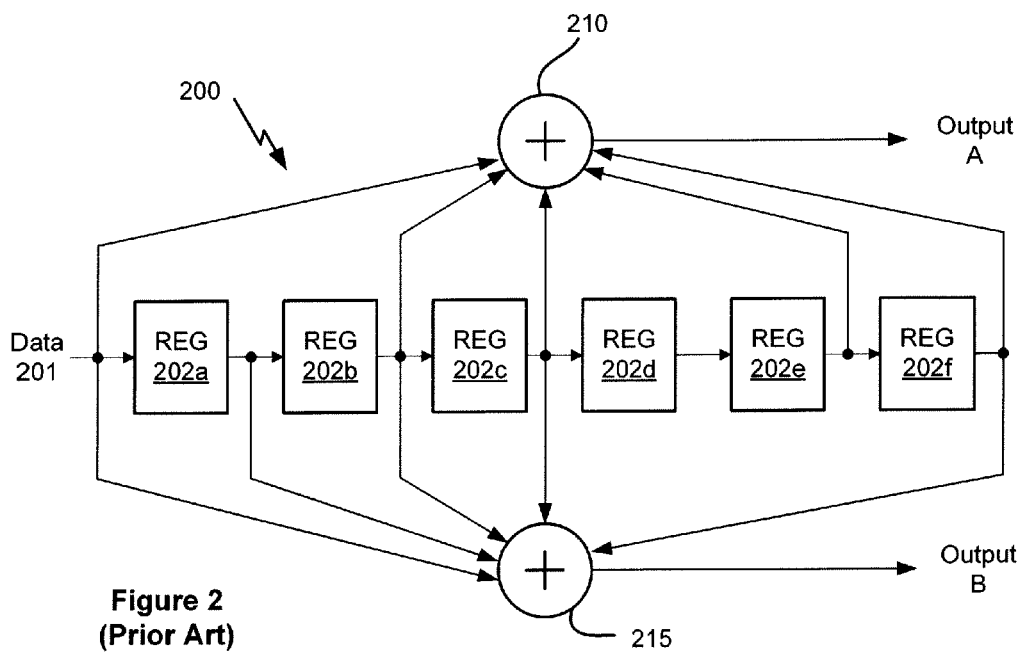
FIG. 2 is a block diagram of a binary convolutional coder that can implement the FEC block of FIG. 1.
Figure 3:
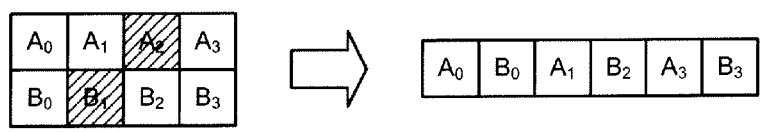
FIG. 3 is a diagram illustrating data puncturing that can be performed by the interleaver and a mapper block of FIG. 1.
Figure 7A1:
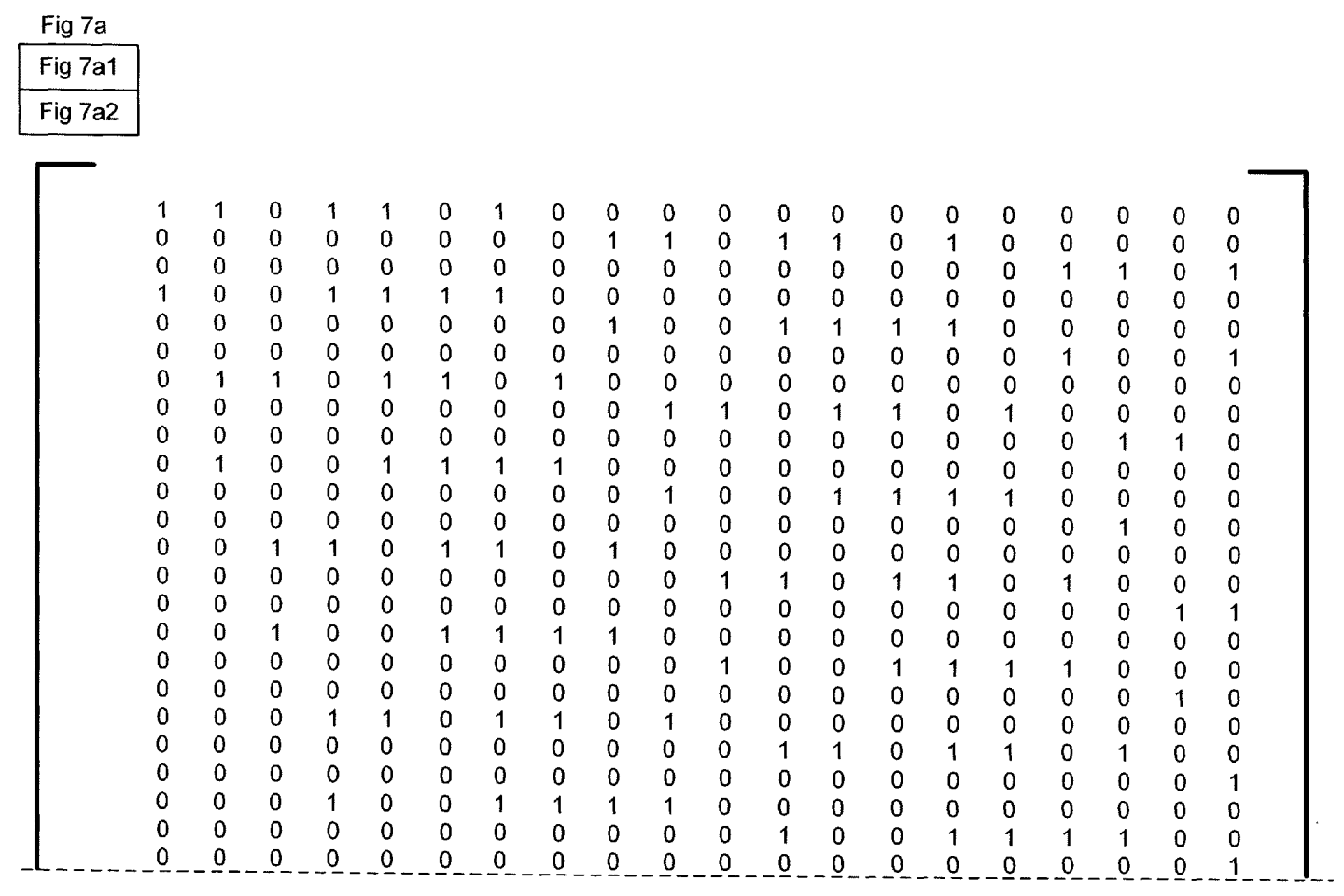

FIG. 7a shows an example of a simple channel coding matrix 700 (48×20=960 elements) for the lowest 802.11a/g rate. As can be seen, each row consists of one of two patterns (which would correspond to the two outputs from the convolutional coder shown in FIG. 2) with a particular starting offset. Therefore, the matrix may be compressed by storing for each row (1) an indication of which of the two patterns is required and (2) in which column the pattern begins. Notably, the required pattern can be indicated by a single bit, whereas the starting column can be indicated by a field of 5 bits (for the 20 columns in matrix 700). Therefore, the channel coding matrix 700 may be compressed to column of 6 bits by 48 rows, or a total of 288 elements. This compressed channel coding matrix 710 is shown in FIG. 7b. Note that the degree of compression may become larger at the higher data rates. For example, for the described 802.11n data rate 300 Mbits/s, the standard 1086×1296 channel coding matrix may be compressed to 1+11=12 columns by 1296 rows, or a total of 15552 elements.

Further, note that a compressed channel coding matrix 710 may advantageously be decompressed for use in the flexible block coder 500 (FIG. 5). Therefore, in one embodiment, the flexible block coder 500 may also include a decompressor (not shown for simplicity). In one embodiment, a processor may perform the decompression. In another embodiment, multiplier 530 may perform the decompression.

Figure 8:
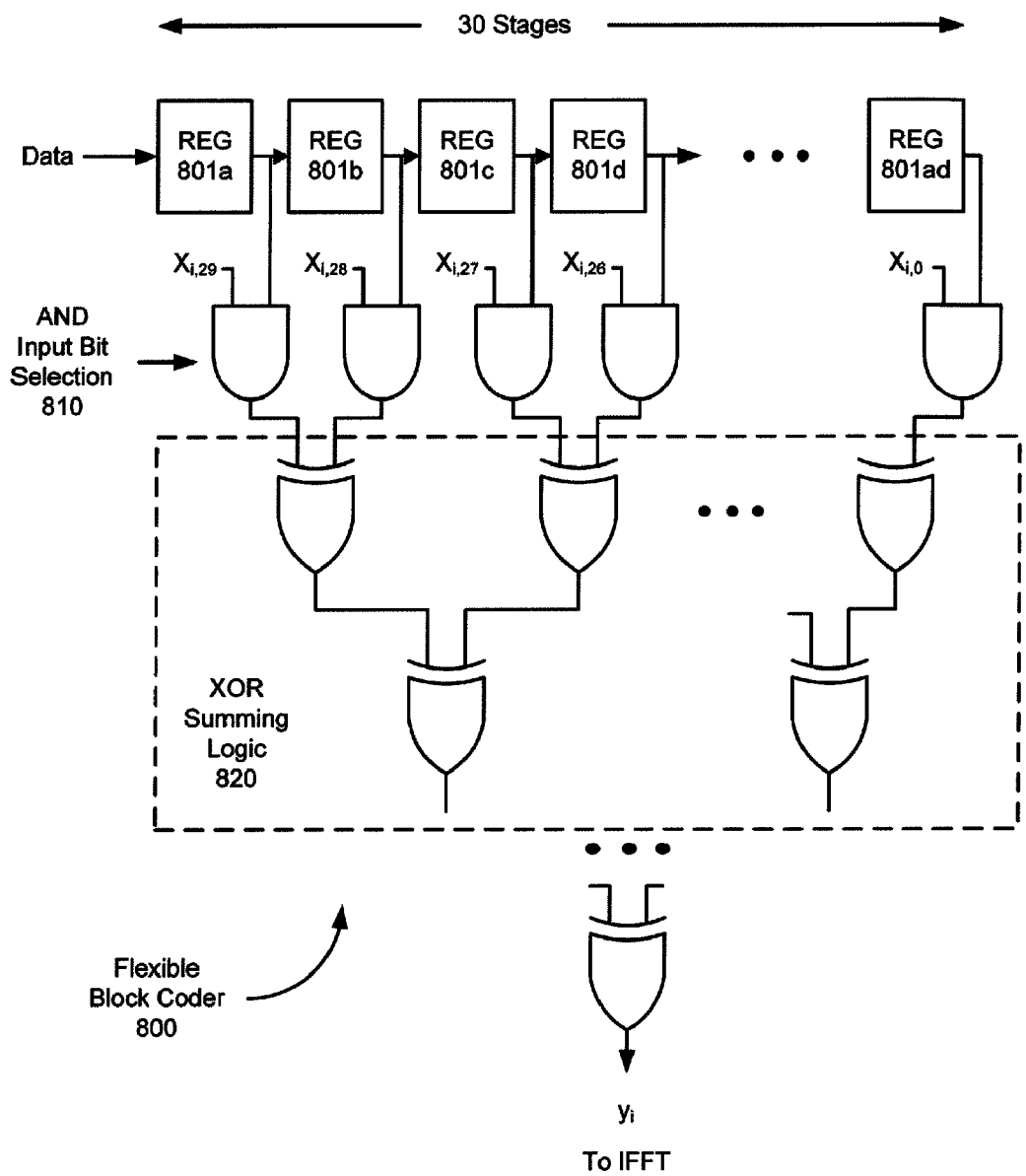
FIG. 8 illustrates another embodiment of a flexible block coder.

FIG. 8 illustrates another embodiment for a flexible block coder 800 in which the coding is performed substantially by hardware, but with some limited coding flexibility provided by software. In this embodiment, an array of registers 801a-801ad (for simplicity, referenced as registers 801) may be coupled in a daisy chain fashion, where the number of shift registers may correspond to the number of elements that would be present in the output vector 515 (FIG. 5). A bit selection block 810 implemented using AND gates (for simplicity, also referenced as AND gates 810) may be used to select the bits from the shift registers 801 that should enter XOR summing logic 820 for each desired output bit.

In FIG. 8, the outputs of shift registers 801 are coupled to the inputs of corresponding AND gates 810. The other inputs to AND gates 810 may be driven by a row in a channel coding matrix (i.e. entries/selectors $x_{i,0}$-$x_{i,29}$, wherein i is a particular row in the channel coding matrix) sequentially, thereby producing each element of the output vector sequentially. In another embodiment, another bit selecting mechanism, such as multiplexers, could also be used in place of the AND gates 820. In that embodiment, the multiplexers would choose between a fixed input (e.g. "0") and the bits in the shift registers 801. These multiplexers could be controlled by a row in the channel coding matrix. A plurality of XOR gates, which form XOR summing logic 820, may be configured into an XOR tree to execute the modulo 2 sum dictated by a matrix multiplication (e.g. the multiplication of the channel coding matrix and the output vector). One embodiment of flexible block coder 800 may provide an exemplary 6 Mb/s implementation.

Notably, further optimization of the modulo 2 sum may be possible. Specifically, inspection of the channel coding matrix 700 (FIG. 7a) indicates that no more than 5 of the input bits may be modulo 2 summed to obtain a given output bit. Therefore, the XOR summing logic 820 may be reduced to a much smaller tree that has just 5 inputs, or even just a single 5 input XOR gate. Suitable selection means, based, for example, on the AND gates 810 or multiplexers, may be used to select the appropriate 5 bits to direct this reduced XOR summing logic.

FIG. 9 illustrates a list 900 of exemplary compressed and non-compressed channel coding matrices for both exemplary 6 Mbs and 54 Mbs modulation coding schemes. A first column 910 indicates a starting point; a second column 920 indicates which polynomial might be selected (e.g., 1:133, 0:171); a third column 930 indicates a 5-bit binary representation of the starting point indicated in 910; and a fourth column 940 indicates a 6-bit binary representation of the polynomial indicated in 920.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be readily apparent.

For example, if an output vector 515 is stored in memory 518, one potential selection mechanism might be based on accessing that output vector 515 and passing it to reduced XOR summing logic. In one embodiment, a contiguous block of 6 or 7 bits, which represent the bits within a conventional convolutional encoder (see FIG. 2), might be accessed. This memory-based system could use the information contained in a (potentially compressed) channel coding matrix to identify and use bits within the output vector which might be needed to compute a given output bit in a processed data vector.

Note that in some embodiments, processing of the output of flexible block coder 410 can be done without IFFT 130. For example, in one embodiment, CCK encoding may be performed by analog and RF block 140, as indicated by arrow 411.

As noted above, certain functions of the flexible block coder may advantageously be implemented in one or more computer readable media, comprising programs that execute on a programmable system including at least one programmable processor coupled to receive at least one of data and instructions from, and to transmit data and instructions to, a data storage system, at least one input device, and at least one output device. Each computer program may be implemented in, by way of non-limiting example, a high-level procedural or object-oriented programming language, or in assembly or machine language if desired; and in any case, the language may be a compiled or interpreted language. Suitable processors may include, by way of example, both general and special-purpose microprocessors, as well as other types of microcontrollers. Generally, a processor will receive instructions and data from a read-only memory and/or a random access memory. Generally, a computer will include one or more mass storage devices for storing data files; such storage devices may include magnetic disks, such as internal hard disks and removable disks, magneto-optical disks, solid-state (e.g., flash) disks and optical disks. Storage devices suitable for tangibly embodying computer program instructions and data may include all forms of non-volatile memory, including by way of example semiconductor memory devices, such as EPROM, EEPROM, and flash memory devices, magnetic disks such as internal hard disks and removable disks, magneto-optical disks, and CDROM disks.

Accordingly, it is intended that the scope of the invention be defined by the following Claims and their equivalents.

The invention claimed is:

1. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, wherein a number of rows of the configurable channel coding matrix equals a size of the output vector, and a number of columns of the configurable channel coding matrix equals a size of the processed data vector, the multiplier generating the processed data vector;
an Inverse Fast Fourier Transform (IFFT) block for performing an IFFT on the processed data vector;
an analog and radio frequency block for processing an output of the IFFT block and generating a transmit signal; and
an antenna for transmitting the transmit signal.

2. The configurable transmitter of claim 1, wherein the data formatter is configured to form an input vector including at least a number of data bits able to be modulated by the IFFT block.

3. The configurable transmitter of claim 2, wherein the data formatter is configured to modify the input vector based on legacy compatibility.

4. The configurable transmitter of claim 2, wherein the data formatter is implemented by a processor.

5. The configurable transmitter of claim 1, wherein the data formatter is configured to form an input vector including a number of data bits able to be modulated by the IFFT block.

6. The configurable transmitter of claim 1, wherein the data formatter is configured to produce a forward error correction (FEC) block code.

7. The configurable transmitter of claim 6, wherein the FEC block code is a low density parity code (LDPC).

8. The configurable transmitter of claim 1, wherein the flexible block coder further includes a memory for storing at least the configurable channel coding matrix.

9. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, the multiplier generating the processed data vector;
an Inverse Fast Fourier Transform (IFFT) block for performing an IFFT on the processed data vector;
an analog and radio frequency block for processing an output of the IFFT block and generating a transmit signal; and
an antenna for transmitting the transmit signal,
wherein the data formatter is configured to form an input vector including at least a number of data bits able to be modulated by the IFFT block, and wherein the data formatter is configured to modify the input vector to create output sequences that match those from a convolutional coder.

10. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, the multiplier generating the processed data vector;
an Inverse Fast Fourier Transform (IFFT) block for performing an IFFT on the processed data vector;
an analog and radio frequency block for processing an output of the IFFT block and generating a transmit signal; and
an antenna for transmitting the transmit signal,
wherein the data formatter is configured to form an input vector including at least a number of data bits able to be modulated by the IFFT block, and wherein the data formatter is configured to modify the input vector by adding 6 bits, thereby matching bits from convolutional coder conforming to IEEE 802.11a/g/n.

11. The configurable transmitter of claim 10, wherein the 6 bits are equal to a last 6 bits of a previous input vector.

12. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, the multiplier generating the processed data vector;
an Inverse Fast Fourier Transform (IFFT) block for performing an IFFT on the processed data vector;
an analog and radio frequency block for processing an output of the IFFT block and generating a transmit signal; and
an antenna for transmitting the transmit signal,
wherein the data formatter is configured to form an input vector including at least a number of data bits able to be modulated by the IFFT block, and wherein the data formatter is configured to modify the input vector by adding 12 bits, thereby matching bits from two convolutional coders conforming to IEEE 802.11a/g/n.

13. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, the multiplier generating the processed data vector;
an Inverse Fast Fourier Transform (IFFT) block for performing an IFFT on the processed data vector;
an analog and radio frequency block for processing an output of the IFFT block and generating a transmit signal; and
an antenna for transmitting the transmit signal,
wherein the data formatter is configured to form an input vector including at least a number of data bits able to be modulated by the IFFT block, and wherein the data formatter is configured to modify the input vector based on data rate.

14. The configurable transmitter of claim 13, wherein a size of the processed data vector is equal to a product of the output vector and an inverse of a coding rate.

15. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, the multiplier generating the processed data vector;
an Inverse Fast Fourier Transform (IFFT) block for performing an IFFT on the processed data vector;
an analog and radio frequency block for processing an output of the IFFT block and generating a transmit signal; and
an antenna for transmitting the transmit signal,
wherein the data formatter is configured to form an input vector including at least a number of data bits able to be modulated by the IFFT block, and wherein dimensions of the configurable channel coding matrix depend on sizes of the output vector and the processed data vector.

16. A method for transmitting in a wireless communication system, the method comprising:
performing forward error correction and mapping of a data stream to generate a processed data vector by performing steps including:
formatting the data stream into an output vector; and
multiplying the output vector by a channel coding matrix to generate the processed data vector, wherein a number of rows of the channel coding matrix equals a size of the output vector, and a number of columns of the channel coding matrix equals a size of the processed data vector, the channel coding matrix being configurable;
processing the processed data vector and generating a transmit signal; and
transmitting the transmit signal.

17. The method of claim 16, wherein formatting the data stream includes forming an input vector including at least a number of data bits able to be modulated by an Inverse Fast Fourier Transform (IFFT) block.

18. The method of claim 17, wherein formatting the data stream includes modifying the input vector based on legacy compatibility.

19. The method of claim 17, wherein formatting the data stream is performed using software.

20. The method of claim 16, wherein formatting the data stream includes forming an input vector including a number of data bits able to be modulated by at least two Inverse Fast Fourier Transform (IFFT) blocks.

21. The method of claim 20, wherein a number of IFFT blocks is an integer.

22. The method of claim 16, further including storing at least the channel coding matrix.

23. The method of claim 16, wherein formatting the data stream is performed using a forward error correction (FEC) block code.

24. The method of claim 23, wherein the FEC block code is a low density parity code (LDPC).

25. A method for transmitting in a wireless communication system, the method comprising:
performing forward error correction and mapping of a data stream to generate a processed data vector by performing steps including:
formatting the data stream into an output vector; and
multiplying the output vector by a channel coding matrix to generate the processed data vector, the channel coding matrix being configurable;
processing the processed data vector and generating a transmit signal; and
transmitting the transmit signal,
wherein formatting the data stream includes forming an input vector including at least a number of data bits able to be modulated by an Inverse Fast Fourier Transform (IFFT) block, and wherein formatting the data stream includes modifying the input vector to create output sequences that match those from a convolutional coder.

26. A method for transmitting in a wireless communication system, the method comprising:
performing forward error correction and mapping of a data stream to generate a processed data vector by performing steps including:
formatting the data stream into an output vector; and
multiplying the output vector by a channel coding matrix to generate the processed data vector, the channel coding matrix being configurable;
processing the processed data vector and generating a transmit signal; and
transmitting the transmit signal,
wherein formatting the data stream includes forming an input vector including at least a number of data bits able to be modulated by an Inverse Fast Fourier Transform (IFFT) block, and wherein formatting the data stream includes modifying the input vector by adding 6 bits, thereby matching bits from a convolutional coder conforming to IEEE 802.11a/g/n.

27. The method of claim 26, wherein the 6 bits are equal to a last 6 bits of a previous input vector.

28. A method for transmitting in a wireless communication system, the method comprising:
performing forward error correction and mapping of a data stream to generate a processed data vector by performing steps including:
formatting the data stream into an output vector; and
multiplying the output vector by a channel coding matrix to generate the processed data vector, the channel coding matrix being configurable;
processing the processed data vector and generating a transmit signal; and
transmitting the transmit signal,
wherein formatting the data stream includes forming an input vector including at least a number of data bits able to be modulated by an Inverse Fast Fourier Transform (IFFT) block, and wherein formatting the data stream includes modifying the input vector by adding 12 bits, thereby matching bits from two convolutional coders conforming to IEEE 802.11a/g/n.

29. A method for transmitting in a wireless communication system, the method comprising:
performing forward error correction and mapping of a data stream to generate a processed data vector by performing steps including:
formatting the data stream into an output vector; and
multiplying the output vector by a channel coding matrix to generate the processed data vector, the channel coding matrix being configurable;
processing the processed data vector and generating a transmit signal; and
transmitting the transmit signal,
wherein formatting the data stream includes forming an input vector including at least a number of data bits able to be modulated by an Inverse Fast Fourier Transform (IFFT) block, and wherein formatting the data stream includes modifying the input vector based on data rate.

30. The method of claim 29, wherein a size of the processed data vector is equal to a product of the output vector and an inverse of a coding rate.

31. A method for transmitting in a wireless communication system, the method comprising:
performing forward error correction and mapping of a data stream to generate a processed data vector by performing steps including:
formatting the data stream into an output vector; and
multiplying the output vector by a channel coding matrix to generate the processed data vector, the channel coding matrix being configurable;
processing the processed data vector and generating a transmit signal; and
transmitting the transmit signal,
wherein formatting the data stream includes forming an input vector including at least a number of data bits able to be modulated by an Inverse Fast Fourier Transform (IFFT) block,
wherein formatting the data stream includes forming an input vector including at least a number of data bits able to be modulated by the IFFT block, and wherein dimensions of the channel coding matrix depend on sizes of the output vector and the processed data vector.

32. A method for transmitting in a wireless communication system, the method comprising:
performing forward error correction and mapping of a data stream to generate a processed data vector by performing steps including:
formatting the data stream into an output vector;
multiplying the output vector by a channel coding matrix to generate the processed data vector, the channel coding matrix being configurable; and
compressing the channel coding matrix;
processing the processed data vector and generating a transmit signal; and
transmitting the transmit signal,
wherein formatting the data stream includes forming an input vector including at least a number of data bits able to be modulated by an Inverse Fast Fourier Transform (IFFT) block.

33. The method of claim 32, wherein compressing the channel coding matrix includes indicating which of two patterns is required, and in which column a pattern begins.

34. The method of claim 33, wherein a required pattern is indicated by a single bit.

35. The method of claim 32, further including decompressing the compressed channel coding matrix before multiplying with the output vector.

36. A configurable transmitter for a wireless communication system, the configurable transmitter comprising:
a flexible block coder for performing forward error correction and mapping of a data stream to generate a processed data vector, the flexible block coder including:
a plurality of registers connected in a daisy chain;
a plurality of bit selectors for selecting outputs of the plurality of registers; and
an XOR tree for receiving outputs from the plurality of bit selectors and generating the processed data vector;
an Inverse Fast Fourier Transform (IFFT) block for performing an IFFT on the processed data vector;
an analog and radio frequency block for modulating an output of the IFFT block and preparing a transmit signal; and
an antenna for transmitting the transmit signal.

37. The configurable transmitter of claim 36, wherein the bit selectors are AND gates receiving the outputs of the plurality of registers and entries from a row of a channel coding matrix.

38. The configurable transmitter of claim 36, wherein the bit selectors are multiplexers receiving the outputs of the plurality of registers and a fixed logic value, the multiplexers being controlled by entries from a row of a channel coding matrix.

39. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, wherein a number of rows of the configurable channel coding matrix equals a size of the output vector, and a number of columns of the configurable channel coding matrix equals a size of the processed data vector, the multiplier generating the processed data vector;
an analog and radio frequency block for processing an output of the flexible block coder and generating a transmit signal; and
an antenna for transmitting the transmit signal.

40. The configurable transmitter of claim 39, wherein the data formatter is configured to form an input vector.

41. The configurable transmitter of claim 40, wherein the data formatter is configured to modify the input vector based on legacy compatibility.

42. The configurable transmitter of claim 40, wherein the data formatter is implemented by a processor.

43. The configurable transmitter of claim 39, wherein the flexible block coder further includes a memory for storing at least the configurable channel coding matrix.

44. The configurable transmitter of claim 39, wherein the data formatter is configured to produce a forward error correction (FEC) block code.

45. The configurable transmitter of claim 44, wherein the FEC block code is a low density parity code (LDPC).

46. A configurable transmitter for a wireless communication system, the configurable transmitter comprising:
a flexible block coder for performing forward error correction and mapping of a data stream to generate a processed data vector, the flexible block coder including:
a data formatter for formatting the data stream into an output vector; and
a multiplier for multiplying the output vector by a configurable channel coding matrix, the multiplier generating the processed data vector;
an analog and radio frequency block for processing an output of the flexible block coder and generating a transmit signal; and
an antenna for transmitting the transmit signal,
wherein the data formatter is configured to form an input vector, and wherein the data formatter is configured to modify the input vector to create output sequences that match those from a convolutional coder.

47. A configurable transmitter for a wireless communication system, the configurable transmitter comprising:
a flexible block coder for performing forward error correction and mapping of a data stream to generate a processed data vector, the flexible block coder including:

a data formatter for formatting the data stream into an output vector; and a multiplier for multiplying the output vector by a configurable channel coding matrix, the multiplier generating the processed data vector;

an analog and radio frequency block for processing an output of the flexible block coder and generating a transmit signal; and an antenna for transmitting the transmit signal, wherein the data formatter is configured to form an input vector, and wherein the data formatter is configured to modify the input vector by adding 6 bits, thereby matching bits from a convolutional coder conforming to IEEE 802.11a/g/n.

48. The configurable transmitter of claim 47, wherein the 6 bits are equal to a last 6 bits of a previous input vector.

49. A configurable transmitter for a wireless communication system, the configurable transmitter comprising:

a flexible block coder for performing forward error correction and mapping of a data stream to generate a processed data vector, the flexible block coder including:

a data formatter for formatting the data stream into an output vector; and a multiplier for multiplying the output vector by a configurable channel coding matrix, the multiplier generating the processed data vector;

an analog and radio frequency block for processing an Output of the flexible block coder and generating a transmit signal; and an antenna for transmitting the transmit signal, wherein the data formatter is configured to form an input vector, and wherein the data formatter is configured to modify the input vector by adding 12 bits, thereby matching bits from two convolutional coders conforming to IEEE 802.11a/g/n.

50. A configurable transmitter for a wireless communication system, the configurable transmitter comprising:

a flexible block coder for performing forward error correction and mapping of a data stream to generate a processed data vector, the flexible block coder including:

a data formatter for formatting the data stream into an output vector; and a multiplier for multiplying the output vector by a configurable channel coding matrix, the multiplier generating the processed data vector;

an analog and radio frequency block for processing an output of the flexible block coder and generating a transmit signal; and an antenna for transmitting the transmit signal, wherein the data formatter is configured to form an input vector, and wherein the data formatter is configured to modify the input vector based on data rate.

51. The configurable transmitter of claim 50, wherein a size of the processed data vector is equal to a product of the output vector and an inverse of a coding rate.

52. A configurable transmitter for a wireless communication system, the configurable transmitter comprising:

a flexible block coder for performing forward error correction and mapping of a data stream to generate a processed data vector, the flexible block coder including:

a data formatter for formatting the data stream into an output vector; and a multiplier for multiplying the output vector by a configurable channel coding matrix, the multiplier generating the processed data vector;

an analog and radio frequency block for processing an output of the flexible block coder and generating a transmit signal; and an antenna for transmitting the transmit signal, wherein the data formatter is configured to form an input vector, and wherein dimensions of the configurable channel coding matrix depend on sizes of the output vector and the processed data vector.

* * * * *